(12) United States Patent
Robl et al.

(10) Patent No.: US 10,602,629 B2
(45) Date of Patent: Mar. 24, 2020

(54) PROTECTIVE HOUSING FOR A CONTROL UNIT

(71) Applicant: Endress+Hauser Conducta GmbH+Co. KG, Gerlingen (DE)

(72) Inventors: Stefan Robl, Hünxe (DE); Michael Dieterich, Waiblingen (DE)

(73) Assignee: Endress+Hauser Conducta GmbH+Co. KG, Gerlingen (DE)

(*) Notice: Subject to any disclaimer, the term of this patent is extended or adjusted under 35 U.S.C. 154(b) by 0 days.

(21) Appl. No.: 16/407,309

(22) Filed: May 9, 2019

(65) Prior Publication Data

US 2019/0350097 A1    Nov. 14, 2019

(30) Foreign Application Priority Data

May 9, 2018 (DE) .......................... 10 2018 111 228

(51) Int. Cl.
*H05K 5/00* (2006.01)
*H05K 5/02* (2006.01)

(52) U.S. Cl.
CPC ......... *H05K 5/0217* (2013.01); *H05K 5/0004* (2013.01)

(58) Field of Classification Search
CPC ...................................................... H05K 7/00
See application file for complete search history.

(56) References Cited

U.S. PATENT DOCUMENTS

2003/0000812 A1* 1/2003 McTaggart ............. B65G 13/12
198/860.1
2015/0331459 A1* 11/2015 Ross ..................... G11B 33/128
361/679.32

FOREIGN PATENT DOCUMENTS

| DE | 20305488 U1 | 8/2004 |
| DE | 102009034023 A1 | 1/2011 |
| DE | 102012102889 A1 | 10/2013 |
| DE | 102014202573 A1 | 8/2015 |

OTHER PUBLICATIONS

Search Report for German Patent Application No. 10 2018 111 228.9, German Patent Office, dated Jan. 29, 2019, 6 pp.

* cited by examiner

*Primary Examiner* — Jerry Wu
(74) *Attorney, Agent, or Firm* — Kelly J. Smith; PatServe

(57) ABSTRACT

The present disclosure relates to a protective housing for a control unit. The protective housing includes at least one resizable cover element having at least two cover plates that are displaceable relative to one another and define a first cover area for protecting at least a first side of the control unit, and a displacement device suitable for displacing the at least two cover plates of the resizable cover element relative to one another so that the first cover area is changed.

12 Claims, 5 Drawing Sheets

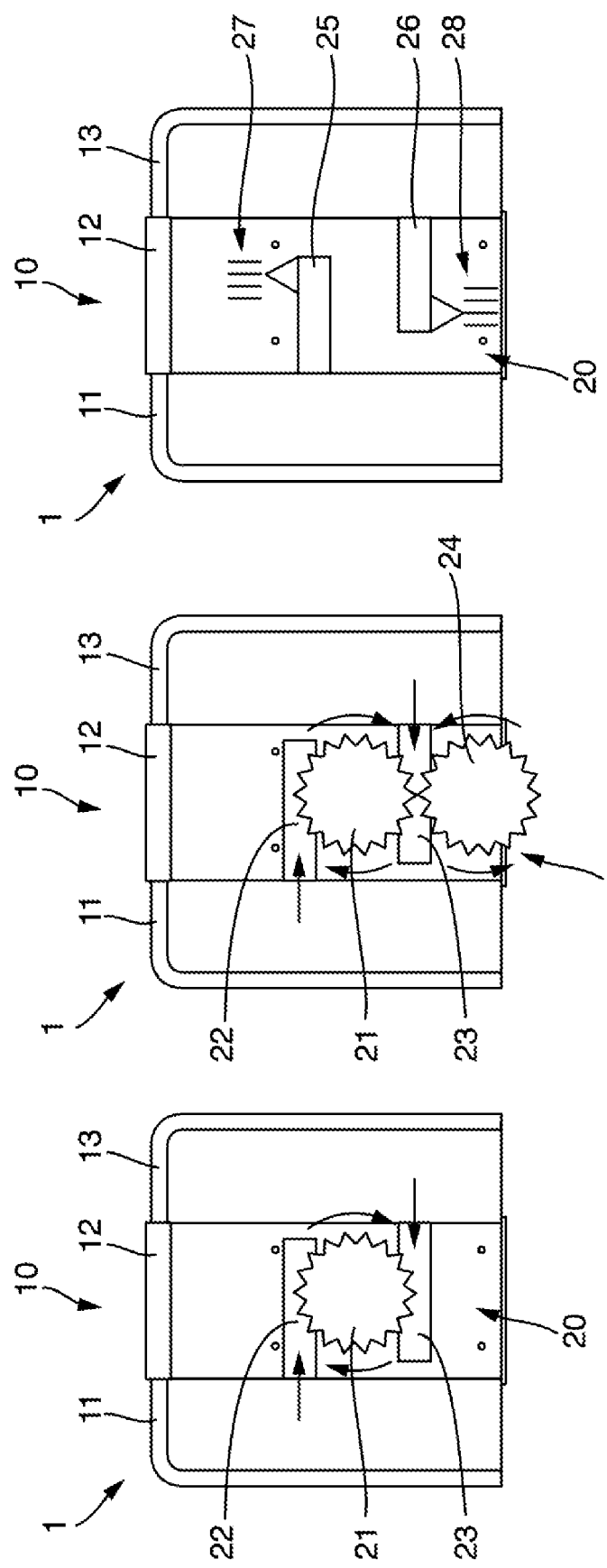

PROTECTIVE HOUSING FOR A CONTROL UNIT

CROSS-REFERENCE TO RELATED APPLICATION

The present application is related to and claims the priority benefit of German Patent Application No. 10 2018 111 228.9, filed on May 9, 2018, the entire contents of which are incorporated herein by reference.

TECHNICAL FIELD

The present disclosure relates to a protective housing for a control unit, for example of a field device of automation technology.

BACKGROUND

In automation technology, in particular in process automation technology and factory automation technology, control units serving to detect and/or modify process variables are frequently used. Used for detecting process variables are sensors, such as fill level measuring devices, flow meters, pressure and temperature measuring devices, pH-redox potential measuring devices, conductivity measuring devices, etc., which detect the relevant process variables, such as fill level, flow, pressure, temperature, pH level, and conductivity. Actuators, such as valves or pumps, are used to influence process variables. The flow rate of a fluid in a pipeline section or the fill level in a container can be changed by means of actuators. One type of control units are so-called field devices, which in principle refer to all devices which are used close to the process and which supply or process process-related information. In the context of the present disclosure, control units also refer to remote I/Os, radio adapters, and/or, in general, devices that are arranged at the field level, for example. A plurality of such control units, which have different dimensions, is manufactured and sold by the patent applicant.

A plurality of protective housings or protective roofs for control units for protection against solar radiation, soiling, weather influences, theft, vandalism, etc. are already known from the prior art. A generic protective housing is disclosed, for example, in DE 10 2012 102 889 A1.

However, these protective housings or protective roofs known from the prior art have the disadvantage that they are designed for a particular control unit with specific dimensions. For a manufacturer offering a plurality of protective housings in their portfolio, these individually designed protective housings create high costs for the design, production and storage of these many different protective housings.

In order to reduce the cost of designing, manufacturing, and storing individual protective housings, a protective housing designed for a control unit with large dimensions may, of course, also be used for a control unit with comparatively small dimensions. However, this is associated with a high space requirement at the predetermined point of use of the protective housing at the user, during storage and during transport from the manufacturer to the user.

SUMMARY

It is, therefore, an object of the present disclosure to provide a protective housing for a plurality of control units each with different dimensions, which protective housing at the same time minimizes the space requirement of the protective housing during storage and transport of the protective housing.

This object is achieved by the protective housing according to the present disclosure according to claim 1, that is, by means of a protective housing for a control unit having at least one resizable cover element with at least two cover plates which are displaceable relatively to one another and which define a first cover area for protecting at least a first side of the control unit, a displacement device suitable for displacing the at least two cover plates of the resizable cover element relatively to one another so that the first cover area is changed.

The variability of the cover area of the protective housing makes it possible to adapt the protective housing for control units having different dimensions in each case. The protective housing is adapted by means of the displacement device, which displaces the at least two cover plates relatively to one another so that the cover area is changed. The protective housing is thus suitable for control units each having different dimensions, which reduces the manufacturing costs of this protective housing due to the larger quantity. Thanks to the adjustability of the size of the protective housing, it is possible to select the smallest possible dimension of the protective housing during the storage and transport of the protective housing. This results in as small a space as possible being taken up during the storage and transport of the protective housing.

According to one embodiment of the present disclosure, the displacement device comprises a locking device which is suitable for locking a displacement of the at least two cover plates of the resizable cover element relative to one another.

According to a further embodiment of the present disclosure, the displacement device comprises a first toothed wheel and a first toothed element complementary to the first toothed wheel, wherein the first toothed wheel is fastened to a first cover plate of the at least two cover plates of the resizable cover element and the first toothed element is fastened to a second cover plate of the at least two cover plates of the resizable cover element, wherein the first toothed wheel engages in the first toothed element so that the first and second cover plate are displaced relatively to one another by rotating the first toothed wheel.

According to a specific embodiment of the present disclosure, the resizable cover element comprises three cover plates displaceable relatively to one another.

According to a particular embodiment of the present disclosure, the displacement device comprises a second toothed element which is fastened to a third cover plate of the three cover plates, which can be displaced relatively to one another, of the resizable cover element such that the first toothed wheel engages in the second toothed element so that the first, second and third cover plate of the resizable cover element are displaced relatively to one another by rotating the first toothed wheel.

According to one exemplary embodiment of the present disclosure, the first toothed wheel is driven by an electric motor.

In a further exemplary embodiment of the present disclosure, the first toothed wheel is disposed on a first cover plate of the at least two cover plates of the resizable cover element such that the first toothed wheel partially projects beyond an edge of the first cover plate so that the first toothed wheel can be operated manually.

According to a further embodiment of the present disclosure, the displacement device comprises at least one elastic snap hook and detents complementary to the elastic snap hook, wherein the at least one elastic snap hook is fastened to a first cover plate of the at least two cover plates of the resizable cover element and the detents are fastened to a second cover plate of the at least two cover plates, wherein the elastic snap hook engages in a first detent of the detents. The elastic snap hook is suitable for detaching from the first detent and for engaging in a second detent of the detents when the first cover plate is displaced relatively to the second cover plate.

According to a particular exemplary embodiment of the present disclosure, the protective housing comprises at least two cover elements, wherein at least one of the at least two cover elements is a resizable cover element, wherein each of the at least two cover elements is connected by flexible connecting elements to at least one other of the at least two cover elements in such a way that all cover elements can be arranged one above the other.

In a specific exemplary embodiment of the present disclosure, the protective housing has at least one securing device which is suitable for securing at least two cover elements to one another so that the secured at least two cover elements are fixed in their relative position to one another.

According to a further embodiment of the present disclosure, the at least one resizable cover element has an overlap region, in which two cover plates, which are displaceable relatively to one another, of the at least one resizable cover element overlap each other when the two cover elements are displaced relatively to each other, wherein the flexible connecting elements are hinges and are arranged outside the overlap region.

In a particular embodiment of the present disclosure, the protective housing further has a front protection and is fastened to the resizable cover element in such a way that the front protection can be moved between a protective position and an access position, wherein the front protection in the protective position is suitable for protecting an operating side of the control unit and the front protection in the access position is suitable for allowing access to the operating side.

In a further embodiment of the present disclosure, the protective housing comprises six cover elements, wherein two of the six cover elements are lateral cover elements and four of the six cover elements are resizable cover elements, wherein one cover element is a base plate and one cover element is the front protection and wherein the six cover elements are suitable for being arranged such that all sides of the control unit are covered.

According to one embodiment of the present disclosure, the protective housing further comprises a latching device suitable for latching the access to the control unit.

According to a specific embodiment of the present disclosure, the latching device is suitable for being electrically latched and electrically unlatched and is suitable for being latched or unlatched by the control unit or by a control system connected to the control unit.

BRIEF DESCRIPTION OF THE DRAWINGS

The present disclosure is explained in more detail based on the following description of the figures.

FIG. 3 shows the protective housing of FIG. 1, wherein the displacement device for displacing the cover plates has a first toothed wheel and two complementary toothed elements;

FIG. 4 shows a further embodiment of the protective housing of FIG. 3, wherein the displacement device further comprises a second toothed wheel;

FIG. 5 shows the protective housing of FIG. 1, wherein the displacement device has two elastic snap hooks and detents complementary to elastic snap hooks;

DETAILED DESCRIPTION

Figure 1:
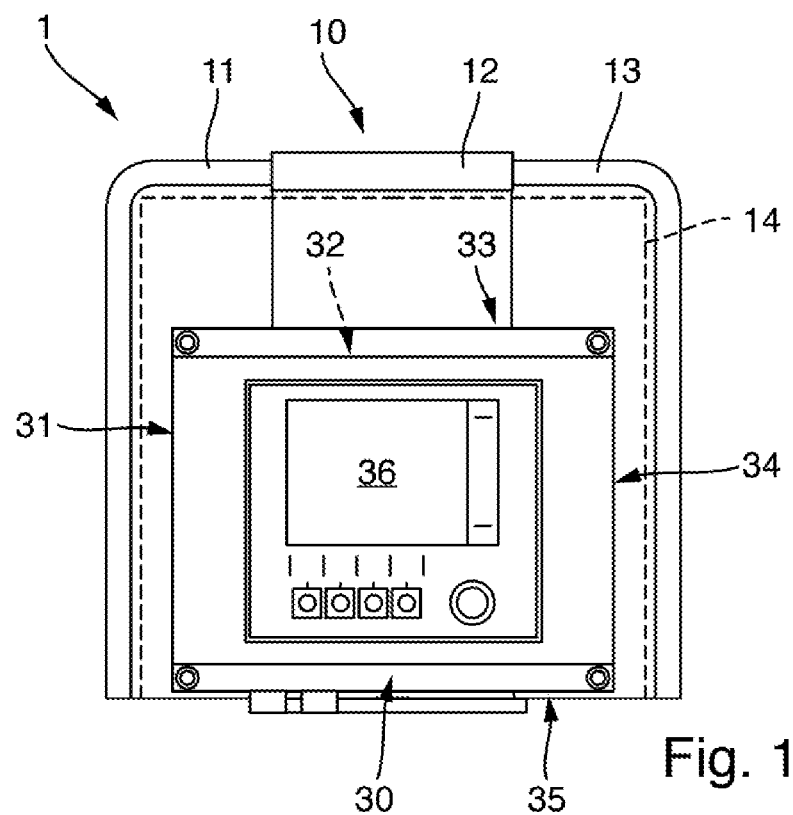
FIG. 1 shows a front view of a protective housing according to the present disclosure, cover plates of which are arranged in a first position relative to each other in order to cover a first control unit.
Figure 2:
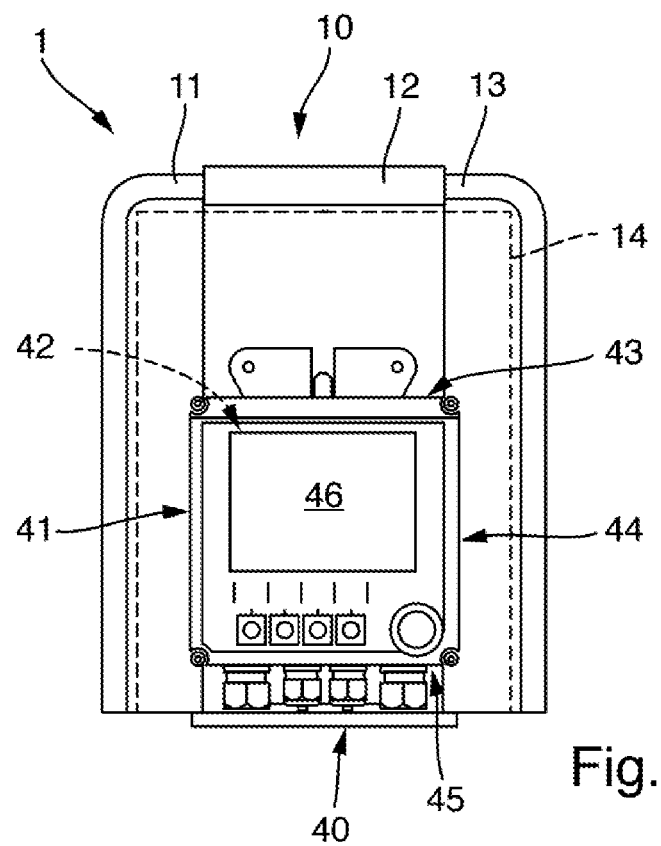
FIG. 2 shows the protective housing of FIG. 1, the cover plates of which are arranged in a second position relative to each other in order to cover a second control unit, which is smaller than the first control unit.

FIGS. 1 and 2 show a protective housing 1 according to the present disclosure for a first control unit 30. The protective housing 1 comprises a resizable cover element 10 and a displacement device 20, which is particularly clearly visible in FIGS. 3 to 5.

In the exemplary embodiment shown in FIG. 1, the resizable cover element 10 comprises a first cover plate 11, a second cover plate 12 and a third cover plate 13. The cover plates 11, 12, 13 together define a first cover area 14 for protecting four sides of the first control unit 30. The cover plates 11, 12, 13 are arranged such that they can be displaced relatively to one another in order to change the first cover area 14.

The cover plates 11, 12, 13 are displaceable relatively to one another between at least two positions. In a first position of the cover plates 11, 12, 13, the first cover area 14 is at a maximum, as shown in FIG. 1 in part by the dashed line, and in a second position of the cover plates 11, 12, 13, the first cover area 14 is at a minimum, as shown in FIG. 2 in part by the dashed line.

FIG. 1 shows the cover plates 11, 12, 13 in their first position, i.e. the first cover area 14 is at a maximum, which allows the first control unit 30 to be covered in a space-saving manner. FIG. 2 shows the cover plates 11, 12, 13 in their second position, i.e. the cover area 14 is at a minimum, which allows a second control unit 40, which has smaller dimensions than the first control unit 30, to be covered in a space-saving manner. A continuous displacement of the cover plates 11, 12, 13 relative to one another allows innumerable positions of the cover plates relative to one another, whereby the first cover area 14 may be changed as desired between its minimum and maximum size.

If the cover plates 11, 12, 13 are in their second position, i.e. the first cover area 14 is at a minimum, this position allows a minimum space requirement during storage at the manufacturer or at the user as well as during transport from the manufacturer to the user.

As shown in FIGS. 1 and 2, the first cover plate 11 extends at least partially over three sides of the control units 30, 40;

namely, a left side 31, 41, a rear side 32, 42, and an upper side 33, 43 of the control unit 30 or of the control unit 40. The second cover plate 12 extends over two sides of the control unit 30 or of the control unit 40, namely over its rear side 32, 42 and over its upper side 33, 43. Like the first cover plate 11, the third cover plate 13 extends over three sides of the control unit 30 or of the control unit 40, namely over a right side 34 44, the rear side 32, 42 and over the upper side 33, 43 of the control unit 30 or of the control unit 40.

The cover plates 11, 12, 13 can be made of plastic, for example. This permits injection molding of cover plates with complex shapes. Alternatively, the cover plates 11, 12, 13 can also be made of sheet metal.

The resizable cover element 10 may, of course, be alternatively designed so that the resizable cover element 10 is suitable for covering, for example, one side, two sides or five sides of the control units 30, 40.

The displacement device 20 mechanically connects the cover plates 11, 12, 13 to each other so that they can be displaced relatively to each other between the first position and the second position. Thanks to the displacement device 20, the first cover area 14 of the cover plates 11, 12, 13 can be changed to protect a control unit 30, 40 against, for example, rain in a space-optimized manner.

FIG. 3 schematically shows an exemplary embodiment of the displacement device 20 which has a first toothed wheel 21, a first toothed element 22 and a second toothed element 23. The toothed wheel 21 is fastened to the second cover plate 12 and engages in the first toothed element 22, which is fastened to the first cover plate 11 and engages in the second toothed element 23, which is fastened to the third cover plate 13.

The first toothed wheel 21 is suitable for being rotated and the first cover plate 11 and the third cover plate 13 are suitable for being displaced relatively to the second cover plate 12. When the first toothed wheel 21 is rotated, for example, by means of a tool or by hand, the first and third cover plates 11, 13 are displaced as illustrated in FIG. 3 by the directional arrows.

FIG. 4 shows an alternative embodiment of the displacement device 20, which, in addition to the exemplary embodiment shown in FIG. 3, has a second toothed wheel 24. In this embodiment, the second toothed wheel 24 is intended to be rotated by the user in order to bring the first and third cover plate 11, 13 into a specific position relative to each other. The second toothed wheel 24 is attached to the second cover plate 12 and mechanically connected to the second toothed element 23 fastened to the third cover plate 13. Thus, the second toothed wheel 24 is also connected to the first toothed wheel 21 through the second toothed element 23 and to the first toothed element 22 via the first toothed wheel 21. Now, when the second gear 24 is rotated, the first and third cover plate 11, 13 are displaced and the first toothed wheel 21 rotates as shown in FIG. 4 by the directional arrows.

Advantageously, the second toothed wheel 24 is arranged in such a way that it projects beyond an end of the resizable cover element 10 so that even with an existing control unit 30, 40, the size of the resizable cover element 10 can be changed easily. This allows a readjustment of the position of the cover plates 11, 12, 13 relatively to one another in order to further minimize the space requirement of the protective housing 1 after installation of the control unit.

As shown in FIG. 5, the displacement device 20 may in addition to the embodiments described above, or alternatively thereto, have a first elastic snap hook 25, a second elastic snap hook 26, a first detent 27 and a second detent 28. The elastic snap hooks have fingers and the detents have indentations in order to receive the fingers of the snap hooks. The first elastic snap hook 25 is fastened to the first cover plate 11 and engages in the first detent 27 which is fastened to the second cover plate 12. The second elastic snap hook 26 is fastened to the third cover plate 13 and engages in the second detent 28 which, like the first detent 27, is fastened to the second cover plate 12. Thus, the cover plates 11, 12, 13 are held in their relative position to each other.

The first and second elastic snap hook 25, 26 is respectively designed in such a way that it twists elastically when a force acts on it. If the force acting on the snap hooks 25, 26 exceeds a predetermined upper limit, the elastic snap hooks 25, 26 disengage from the detents 27, 28 so that the first cover plate 11 and the third cover plate 13 are suitable for being displaced as indicated by the double directional arrow in FIG. 5. If the force acting on the elastic snap hooks falls below the predetermined upper limit, the elastic snap hooks 25, 26 engage again in the detents 27, 28. This makes it possible to adjust the cover area 14, for example by a force applied manually to the first and second cover plate 11, 13.

Figure 6:
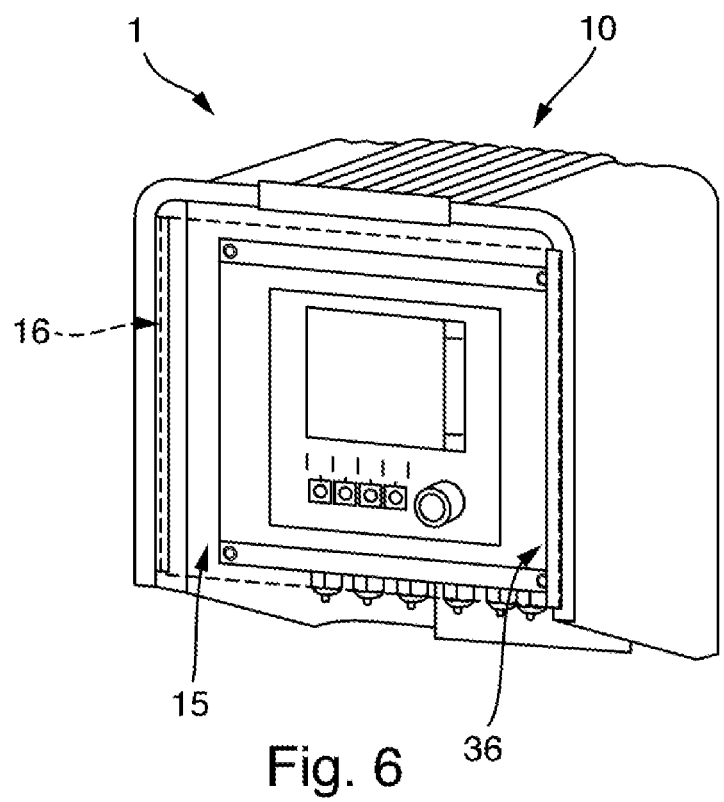
FIG. 6 shows the protective housing of FIG. 1, the cover plates of which are arranged in a first position relative to each other, with a front protection.
Figure 7:
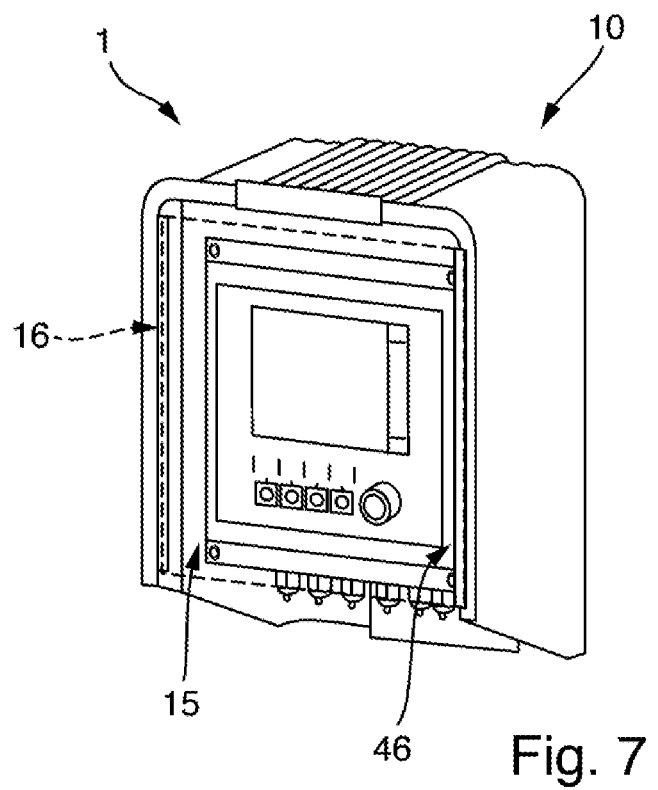
FIG. 7 shows the protective housing of FIG. 2, the cover plates of which are arranged in a second position relative to each other, with a front protection.
Figure 8:
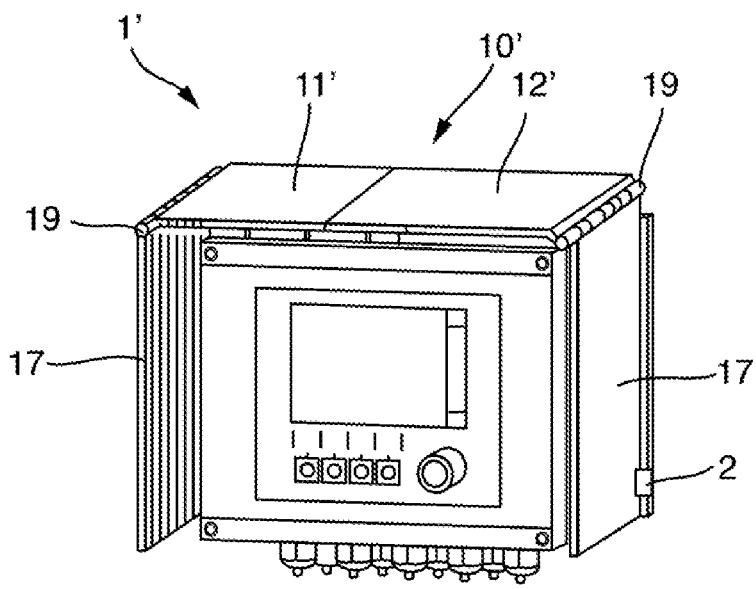
FIG. 8 shows a further embodiment of the protective housing according to the present disclosure, wherein the protective housing has at least one hinge.

FIGS. 6 and 7 show a protective housing 1 with a front protection 15, which defines a second cover area 16 for covering an operating side 36, 46 of the control unit 30, 40. The front protection 15 is fastened to the resizable cover element 10. The second cover area 16 may be changed in its size by moving the front protection 15 between a first position and at least a second position. The first position of the front protection 15 defines a minimum size of the second cover area 16 as shown in FIG. 6 by the dashed line. The second position of the front protection 15 defines a maximum size of the second cover area 16 as shown in FIG. 7 by the dashed line. The direction of the change in size of the front protection 15 is the same as the direction of the change in size of the first cover area 14 of the cover elements 11, 12, 13. The second cover area 16 defined by the front protection 15 can be changed simultaneously with the first cover area 14.

In the exemplary embodiment of FIGS. 6 and 7, the front protection 15 is a roll-up film. The front protection 15 comprises a roll-up mechanism, which makes it possible to lock the film in various rolled-out positions. The front protection 15 can thus be precisely adapted to the resizable cover element 10 so that the first cover area 14 and the second cover area 16 together protect the control unit 30, 40 optimally against, for example, rain.

The front protection 15 is designed to be moved between a protective position and an access position independently of the resizable cover element 10. In the protective position, the front protection 15 connects two opposing lateral cover elements 17. In the access position, the operating side 36, 46 of the control unit 30, 40 is exposed, or at least partially exposed. This allows a user to easily and quickly access the control unit 30, 40 protected by the protective housing 1 without moving the cover plates 11, 12, 13.

The front protection 15 can also be designed as a flexible grid.

FIGS. 8 to 11 show a hinged embodiment of the protective housing 1' with two resizable cover elements 10' and two lateral cover elements 17. The two resizable cover elements 10' are connected to each other by flexible connecting elements 19. The structural and functional design of the two resizable cover elements 10' of FIGS. 8 to 11 is identical to that of the resizable cover element 10, with the exception that each of the two resizable cover elements 10' only has two cover plates 11', 12'. All design variants described with respect to the resizable cover element 10 are also compatible with the two resizable cover elements 10'.

The two lateral cover elements 17 are each connected to one of the two resizable cover elements 10' by flexible connecting elements 19. The two lateral cover plates 17 define a third cover area 18 suitable for protecting the control unit 30, 40 laterally, for example against rain.

Figure 11:
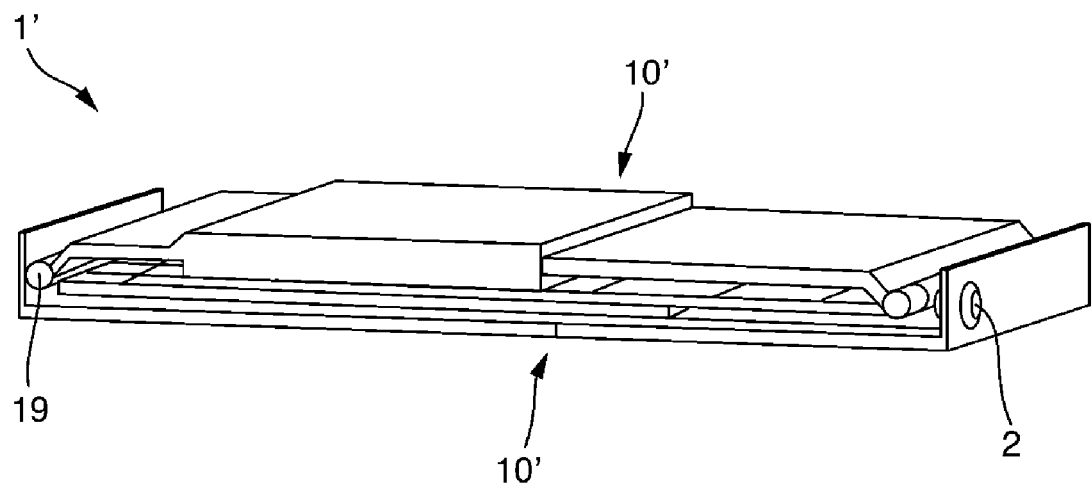
FIG. 11 shows the protective housing of FIG. 8 in a folded form.

The flexible connecting elements 19 allow all cover elements 10', 17 to be arranged in such a way that they come to lie one above the other as shown in FIG. 11. The flexible connecting elements 19 are connected to one of the two resizable cover elements 10 in such a way that a displacement of the cover plates 11, 12, 13 relative to one another is made possible. For example, the flexible connecting elements 19 may be arranged outside an overlap region of the cover plates 11, 12, 13. At least two of the cover plates 11, 12, 13 are arranged one above the other in the overlap region. In the embodiment of FIG. 8 to FIG. 11, the connecting elements 19 are designed as hinges.

Figures 9, 10:
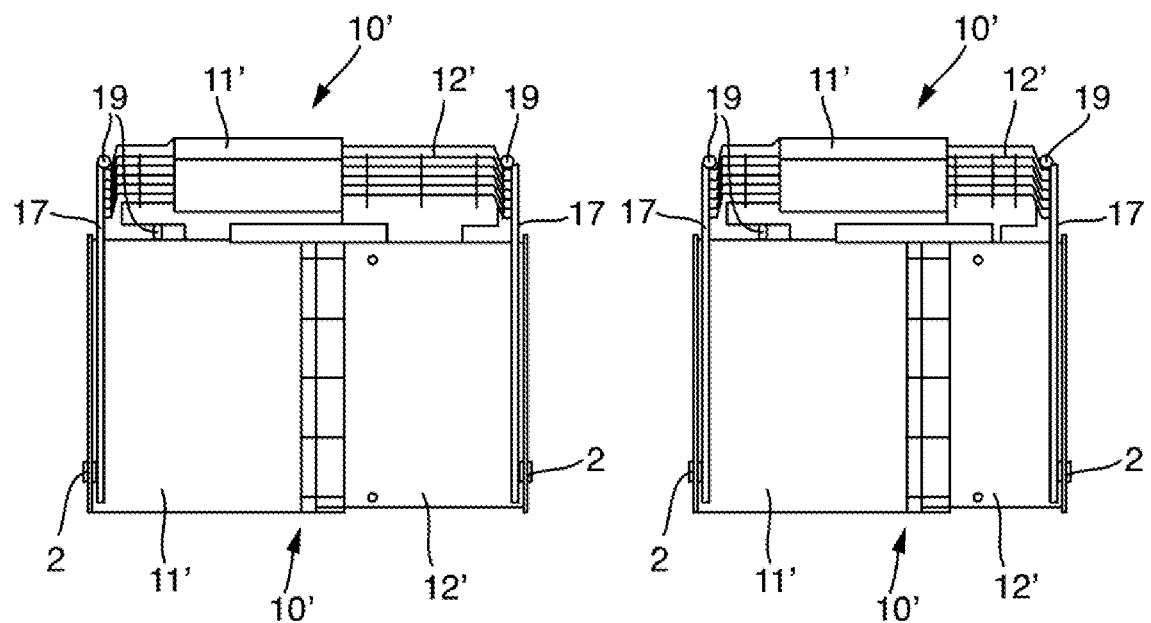
FIG. 9 shows the protective housing of FIG. 8, wherein its cover plates are arranged in a first position.
FIG. 10 shows the protective housing of FIG. 8, wherein its cover plates are arranged in a second position.

The protective housing 1' further comprises two securing devices 2, which each connect a lateral cover element 17 to one of the resizable cover elements 10' as shown in FIG. 9 and FIG. 10. By means of the securing devices 2, a movement between one of the two resizable cover elements 10' and each of the two lateral cover elements 17 is prevented. The securing devices 2 are designed, for example, as push buttons, splints, screws, magnets or cotter pins.

FIG. 11 shows the hinged embodiment of the protective housing 1' in a folded state. In this folded state, the protective housing 1 has a minimal space requirement, which is particularly advantageous for the storage of the protective housing 1' at the manufacturer, for the transport from the manufacturer to the user and for the temporary storage of the protective housing 1' at the user, for example during a maintenance of the control unit 30, 40.

In a further alternative embodiment, which is compatible with the exemplary embodiments described above, the protective housing 1' comprises a locking device (not shown). The locking device is suitable for preventing a displacement of the cover plates 11, 12, 13 relative to one another. Unintentional displacement of the cover plates 11, 12, 13 can thus be avoided. The locking device can be designed, for example, as a shackle lock or padlock.

The locking device may also be suitable for preventing theft of the control unit 30, 40.

In a further alternative embodiment, which is compatible with the exemplary embodiments described above, the protective housing 1' has an electric motor (not shown). The electric motor is mechanically connected to the first toothed wheel 21 in order to bring about a relative displacement of the cover elements 11, 12, 13 to one another. The electric motor is electrically connected to a control unit (not shown) in order to be controlled by a user. The electric motor can also be designed to function as a locking device.

Alternatively to the exemplary embodiment described above with the resizable cover element 10 together with three cover plates 11, 12, 13, the resizable cover element 10 may also have only two cover plates 11, 12. In such an embodiment, the features described in connection with the third cover plate 13 are then omitted.

In addition to the aforementioned features of the protective housing 1', the protective housing 1' may have a base plate (not shown), which defines a fourth cover area, in order to cover a bottom side 35, 45 of the control unit 30, 40. The base plate is structurally and functionally identical to the resizable cover element, with the exception that the base plate is designed such that terminals of the control unit 30, 40 are accessible. For example, an opening for a cable is provided in the base plate. The base plate, together with the front protection 15 and the resizable cover element 10, 10', makes it possible to completely enclose the control unit 30, 40. A maximum protection of the control unit 30, 40 against, for example, solar radiation, rain, theft or vandalism is thus achieved.

It goes without saying that in the hinged design variant of the protective housing 1', two lateral cover elements 17, two resizable cover elements 10', the front protection 15 and the base plate cooperate to provide this maximum protection. The base plate and the front protection 15 are, of course, compatible with all described embodiments.

The invention claimed is:

1. A protective housing for a control unit, comprising: at least one resizable cover element having at least two cover plates that are displaceable relative to one another and define a first cover area for protecting at least a first side of the control unit; and a displacement device configured for displacing the at least two cover plates of the resizable cover element relative to one another so that the first cover area is changed; and the displacement device comprises a first toothed wheel and a first toothed element complementary to the first toothed wheel, wherein the first toothed wheel is fastened to a first cover plate of the at least two cover plates of the resizable cover element and the first toothed element is fastened to a second cover plate of the at least two cover plates of the resizable cover element, wherein the first toothed wheel engages the first toothed element so that the first and second cover plate are displaced relative to one another by rotating the first toothed wheel; and the resizable cover element includes three cover plates that can be displaced relative to one another; the displacement device includes a second toothed element, which is fastened to a third cover plate of the three cover plates, which can be displaced relative to one another, of the resizable cover element such that the first toothed wheel engages the second toothed element so that the first, second and third cover plate of the resizable cover element are displaced relative to one another by rotating the first toothed wheel.

2. The protective housing of claim 1, wherein the displacement device includes a locking device configured for locking a displacement of the at least two cover plates of the resizable cover element relative to each other.

3. The protective housing according to claim 1, wherein the first toothed wheel is driven by an electric motor.

4. The protective housing according to claim 1, wherein the first toothed wheel is disposed on a first cover plate of the at least two cover plates of the resizable cover element such that the first toothed wheel partially projects beyond an edge of the first cover plate so that the first toothed wheel can be operated manually.

5. The protective housing of claim 1, wherein the displacement device includes at least one elastic snap hook and detents complementary to the elastic snap hook, wherein the at least one elastic snap hook is fastened to a first cover plate of the at least two cover plates of the resizable cover element and the detents are fastened to a second cover plate of the at least two cover plates, wherein the elastic snap hook engages a first detent of the detents and is configured for detaching from the first detent and for engaging a second detent of the detents when the first cover plate is displaced relatively to the second cover plate.

6. The protective housing of claim 1, wherein the protective housing includes at least two cover elements, wherein at least one of the at least two cover elements is a resizable cover element, wherein each of the at least two cover elements is connected by flexible connecting elements to at least one other of the at least two cover elements in such a way that all cover elements can be arranged one above the other.

7. The protective housing of claim 1, wherein the protective housing has at least one securing device, which is configured for securing at least two cover elements to one another so that the secured at least two cover elements are fixed in their relative position to one another.

8. The protective housing of claim 1, wherein the at least one resizable cover element has an overlap region in which two cover plates, which are displaceable relative to one another, of the at least one resizable cover element overlap each other when the two cover elements are displaced relative to each other, wherein the flexible connecting elements are hinges and are arranged outside the overlap region.

9. The protective housing of claim 1, wherein the protective housing further includes a front protection that is fastened to the resizable cover element in such a way that the front protection is movable between a protective position and an access position, wherein the front protection in the protective position is configured for protecting an operating side of the control unit and the front protection in the access position is configured for allowing access to the operating side.

10. The protective housing of claim 9, wherein the protective housing includes six cover elements, wherein two of the six cover elements are lateral cover elements and four of the six cover elements are resizable cover elements, wherein one cover element is a base plate and one cover element is the front protection and wherein the six cover elements are configured for being arranged such that all sides of the control unit are covered.

11. The protective housing of claim 1, wherein the protective housing further comprises a latching device configured for latching access to the control unit.

12. The protective housing of claim 11, wherein the latching device is configured for being electrically latched and electrically unlatched and is configured for being latched or unlatched by the control unit or by a control system connected to the control unit.

* * * * *